United States Patent [19]

Tokumo

[11] 4,415,863
[45] Nov. 15, 1983

[54] PULSE WIDTH MODULATION AMPLIFIER

[75] Inventor: Akio Tokumo, Saitama, Japan

[73] Assignee: Pioneer Electronic Corporation, Tokyo, Japan

[21] Appl. No.: 247,033

[22] Filed: Mar. 24, 1981

[51] Int. Cl.³ .............................................. H03F 3/38
[52] U.S. Cl. ...................................... 330/10; 330/298
[58] Field of Search ................. 330/10, 207 A, 207 P, 330/251, 298

[56] References Cited

FOREIGN PATENT DOCUMENTS 55-95409  7/1980  Japan ..................................... 330/10

OTHER PUBLICATIONS

"Amplificateur Audio 100 W Classe D a VMOS", *EAI*, Jun. 15, 1979, pp. 54, 55.

*Primary Examiner*—James B. Mullins
*Attorney, Agent, or Firm*—Sughrue, Mion, Zinn, Macpeak and Seas

[57]  ABSTRACT

A pulse width modulation amplifier having flat frequency characteristics including a comparator having an inverting input terminal coupled to an input signal source through a first resistor with the output of a ramp wave oscillator coupled to the non-inverting input terminal. The output of the comparator is coupled to a switching amplifier and a low-pass filter is coupled between the output of the switching amplifier and a load. A second resistor is coupled between the output of the switching amplifier and the inverting input terminal of the comparator and a capacitor is coupled between the inverting input terminal and ground. The switching amplifier has an output circuit including an excess current detection circuit.

7 Claims, 7 Drawing Figures

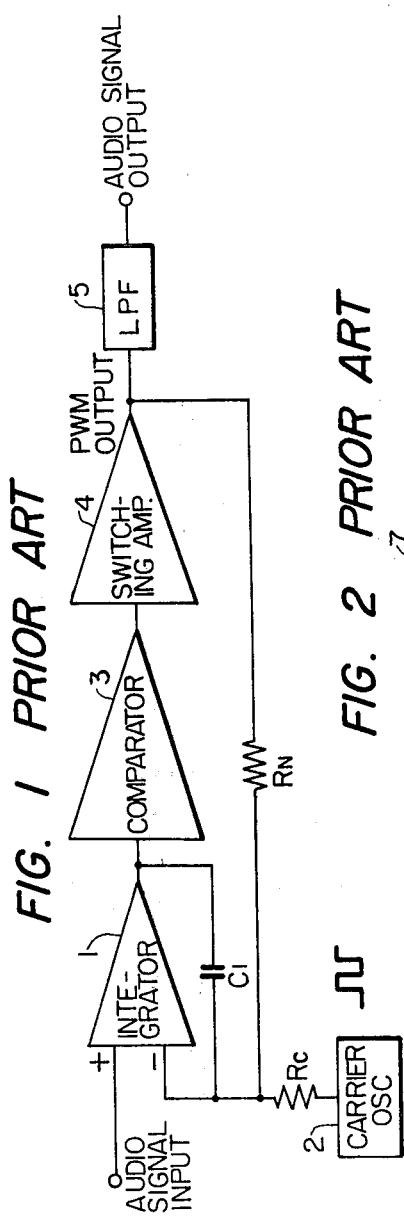
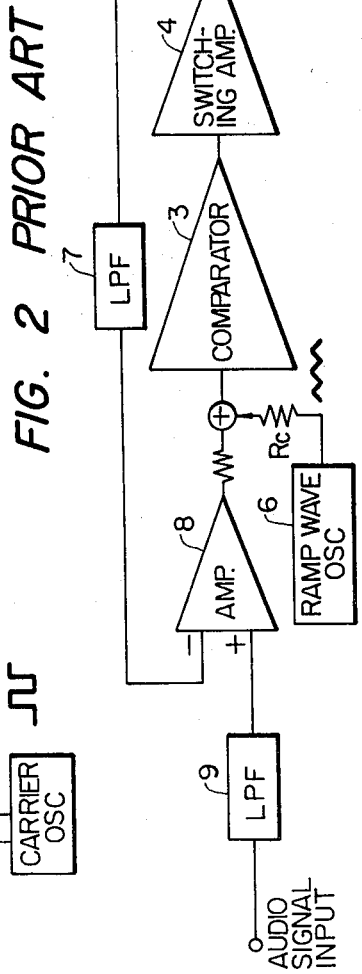
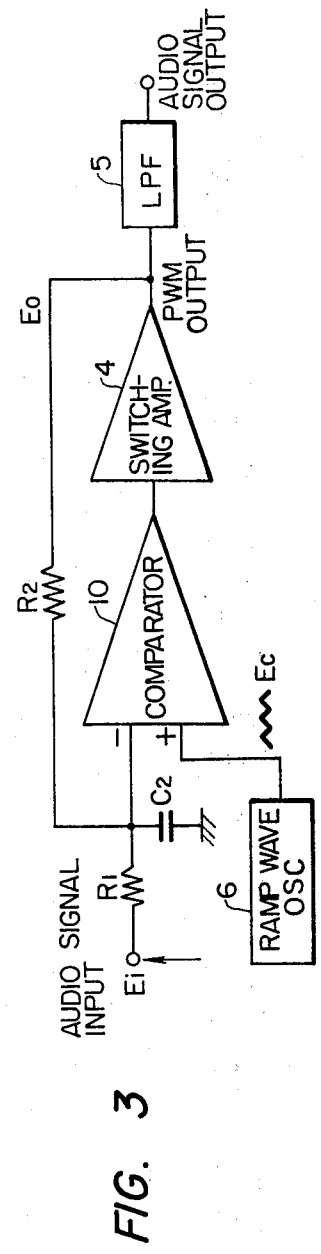
FIG. 1 PRIOR ART
FIG. 2 PRIOR ART
FIG. 3

PULSE WIDTH MODULATION AMPLIFIER

BACKGROUND OF THE INVENTION

The present invention relates generally to pulse width modulation (PWM) amplifiers. An amplifier circuit of this general type functions to convert a low frequency signal such as an audio signal into a pulse width modulated signal, to amplify the modulated signal and to demodulate the latter to obtain the original low frequency signal.

FIG. 1 shows an example of a pulse width modulation amplifier circuit in which an audio signal is applied to a non-inverting input terminal of an integrator 1 including a capacitor $C_1$, and a carrier signal is applied from a rectangular wave oscillator 2 through a resistor $R_c$ to an inverting input terminal of the integrator 1. An output of the integrator is passed through a comparator 3 and a switching amplifier 4 to obtain a pulse width modulated signal which is passed through a low-pass filter 5 which demodulates the signal to thereby obtain an output audio signal. Further, the pulse width modulated signal is fed back through a resistor $R_N$ to the integrator 1 to form a negative feedback loop.

The circuit of FIG. 1 is referred to as a direct feedback system with which the overall frequency characteristic of the circuit is flat due to the passage of the input audio signal through the integrator 1. Moreover, the closed loop phase is within 90° which provides good stability. However, since the closed loop includes the integrator 1, the amount of the negative feedback is 6 dB per octave. Hence, the higher the frequency, the higher the attenuation. Therefore, the signal distortion increases with an increase of the frequency causing the amplifier to be unsuitable to use for high fidelity purposes.

FIG. 2 is another example of a PWM amplifier circuit in which a carrier signal is obtained from a ramp wave oscillator 6 and a low-pass filter 7 is incorporated in a feedback circuit. The audio signal is derived from a pulse width modulated output signal from a switching amplifier 4. Negative feedback is provided to an amplifier 8 disposed on the input side of the circuit. The overall frequency characteristic of the circuit must be corrected by inserting a low-pass filter 9 having the same frequency characteristic as the filter 7 because the frequency characteristic increases from the roll-off point of the filter 7 due to the reverse nature of the bandpass charcteristic thereof. Further, in order to properly determine the attenuation of the carrier signal, it is necessary to set the cut-off frequency $f_e$ of the low-pass filter 7 sufficiently low in comparison with the carrier signal frequency. Therefore, it is difficult to obtain sufficient feedback in high frequency ranges. In addition to this, the frequency characteristic of the amplifier is not flat due to possible characteristic variations of the low-pass filters 7 and 9.

FIG. 4 shows an example of a push-pull output circuit of the switching amplifier 4 of the PWM amplifier of FIG. 1 or 2 in which complementary MOS transistors are used as switching elements. In this circuit, a drain of a P channel type transistor $Q_1$ and a drain of an N channel type transistor $Q_2$ are commonly connected to push-pull drive the load 11, which includes the low-pass filter 5 and a loudspeaker. Sources of the transistors $Q_1$ and $Q_2$ are supplied with power supply voltages of $+V_{cc}$ and $-V_{cc}$, respectively, and gates thereof are supplied with positive and negative parts of the output signal from the comparator 3, respectively. In addition, an excess current detecting circuit is provided to detect excess current flow through the transistors $Q_1$ and $Q_2$ to thereby protect them. In this circuit, a resistor $R_1$ is connected between the power source line and the source of the transistor $Q_1$ to detect the current flowing through $Q_1$. The voltage across the resistor $R_1$ is sensed by a PNP transistor $Q_3$ connected as shown. A detection output indicative of excess current is provided on the collector of the transistor $Q_3$. A suitable protection circuit is operated with this detection output.

With the above-mentioned circuit construction, it is impossible to avoid power loss in the direction circuit because of the series connection of the resistor $R_1$ to the current line resulting in a low overall power efficiency of the PWM amplifier.

An object of the present invention is thus to provide an excess current detecting circuit utilizing a power amplifying active element of switching type which is capable of detecting excess current without lowering the power efficiency of the power amplifier.

SUMMARY OF THE INVENTION

The invention provides a pulse width modulation amplifier which overcomes the aforementioned problems. Specifically, a pulse width modulation amplifier of the invention includes a comparator having an inverting input terminal coupled to an input signal source through a first resistor, a ramp wave oscillator having an output coupled to a non-inverting input of the comparator, a switching amplifier having an input coupled to an output of the comparator, a low-pass filter having an input coupled to an output of the switching amplifier, a second resistor coupled between the output of the switching amplifier and the inverting input terminal of the comparator, and a capacitor coupled between the inverting input terminal of the comparator and ground. Further, the switching amplifier includes an active element the voltage across which is varied in accordance with the output switching state of the comparator. The output voltage of the active element is sensed and an excess current detection signal is produced therefrom indicative of the presence of an excess current flowing through the active element. To generate the excess current detection signal, an output voltage of the active element is passed through a diode and then integrated with the integration output compared with a fixed reference voltage.

The invention also provides a PWM amplifier having in its output stage an excess current detection circuit which functions to detect excess current in the active element in the output stage. The excess current detection circuit of the invention operates to on-off control a conductive channel of the active element and causes the voltage across the conductive channel to be varied correspondingly to the current in the on state so that a voltage is produced according to an output level thereof in the on state and an excess current indicating signal is produced when the voltage reaches a predetermined level.

BRIEF DESCRIPTION OF THE DRAWINGS

FIGS. 1 and 2 show examples of the conventional pulse width modulation amplifiers;

FIG. 3 is a schematic diagram of a preferred embodiment of a pulse width modulation amplifier of the invention;

DESCRIPTION OF THE PREFERRED EMBODIMENTS

Figure 4:
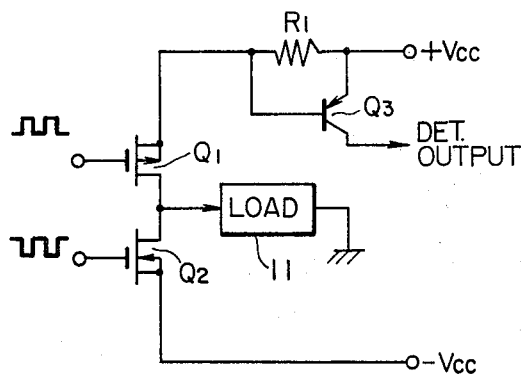
FIG. 4 shows an example of the conventional excess current detecting circuit for the PWM amplifier.

A preferred embodiment of a PWM amplifier constructed according to the present invention will be described with reference to FIG. 3 in which similar components to those of FIGS. 1 and 2 are designated by the same reference numerals as used in these figures. In FIG. 3, an audio signal $E_i$ and a pulse width modulated signal $E_o$ from the output of a switching amplifier 4 are applied additively through resistors $R_1$ and $R_2$ respectively to an inverting input terminal of a comparator 10 having differential inputs. A carrier signal is applied from a ramp wave oscillator 6 to the non-inverting input terminal. The feedback carrier signal is grounded through a capacitor $C_2$.

The feedback voltage $e_N$ from the output voltage $E_o$ of the switching amplifier 4 to the comparator 10 is represented by:

$$e_N = \frac{R_1 // \frac{1}{j\omega C_2}}{R_2 + \left(R_1 // \frac{1}{j\omega C_2}\right)} \cdot E_o = \frac{R_1}{R_1 + R_2 + j\omega C_2 R_1 R_2} E_o, \quad (1)$$

where $R_1//1/j\omega C_2$ indicates the parallel combination of the impedances $R_1$ and $1/j\omega C_2$. The $\omega$ components of the roll-off point is given by:

$$\omega = \frac{R_1 + R_2}{C_2 R_1 R_2}. \quad (2)$$

This is equivalent to a low-pass filter having an attenuation of 6 dB per octave, and therefore the carrier frequency range included in the output signal can be attenuated sufficiently. Assuming the return voltage of the carrier signal is $e_{CB}$, the relation $e_{CB} < < E_c$ (where $E_c$ is the carrier signal voltage) is established and the overall carrier frequency is governed by $E_c$ and the effect of $e_{CB}$ is negligible.

As to the gain $E_o/E_i$ of the closed loop, it can be represented by:

$$\frac{E_o}{E_i} = \left[\frac{R_2}{(j\omega C_2 R_2 + 1)R_1 + R_2}\right] / \left[\frac{1}{A_o} + \frac{R_1}{(j\omega C_2 R_1 + 1)R_2 + R_1}\right]. \quad (3)$$

Assuming the open-loop gain $A_o$ is $>>1$, $$E_o/E_i \approx R_2/R_1 \quad (4)$$

Therefore, it is possible to provide a flat characteristic regardless of the frequency and the value of the capacitor $C_2$. That is, there is no need for precisely setting the characteristic of the low-pass filter exactly as is absolutely necessary for the circuit of FIG. 2.

The amount of negative feedback $A_{NF}$ is given by (open-loop gain)/(closed loop gain). The open-loop gain $A_o$ is determined by the ratio of the peak of the ramp carrier signal voltage to the peak of the output voltage $E_o$, i.e., $A_o \approx$ (power source voltage)/(ramp wave peak voltage). Using the expression for the closed loop gain of equation (3) the amount of negative feedback $A_{NF}$ can be expressed as:

$$A_{NF} = \frac{A_o}{\left[\frac{R_2}{(j\omega C_2 R_2 + 1)R_1 + R_2}\right] / \left[\frac{1}{A_o} + \frac{R_1}{(j\omega C_2 R_1 + 1)R_2 + R_1}\right]} \quad (5)$$

$$= \frac{R_1(1 + A_o) + R_2}{R_2} + j\omega C_2 R_1.$$

Therefore, $\omega$ of the roll-off point of $A_{NT}$ is:

$$\omega = \frac{R_1(1 + A_o) + R_2}{C_2 R_1 R_2} = \frac{R_1 + R_2}{C_2 R_1 R_2} + \frac{A_o}{C_2 R_2}. \quad (6)$$

That is, $\omega$ of the roll-off point where $A_o$ becomes large is governed mainly by the term of $A_o/C_2 R_2$. Thus:

$$\omega = \frac{A_o}{C_2 R_2}. \quad (7)$$

This is a substantially higher frequency than the roll-off point of the feedback voltage $e_N$ in the equation (1). Therefore, the amount of feedback is substantially constant throughout the entire frequency range including high frequencies resulting in a reduction in distortion, particularly in the high frequency range, in comparison with the conventional circuit arrangement.

According to the present invention, the frequency characteristic of the amplifier is flat and the amount of negative feedback is constant throughout the frequency range resulting in a substantial improvement in the high frequency response of the amplifier.

Figure 5:
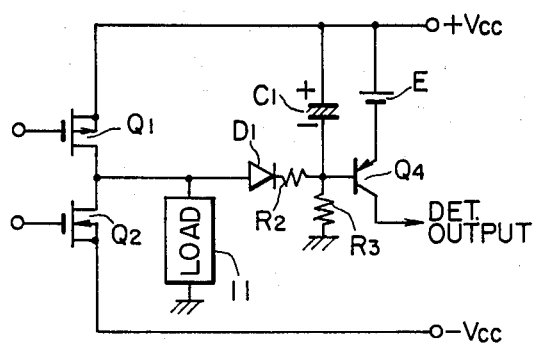
FIG. 5 is a circuit diagram of a preferred embodiment of an output circuit of the PWM amplifier of the invention.

FIG. 5 is a circuit diagram showing an output circuit of the switching amplifier 4 including an excess current detection circuit for a push-pull connected output switching transistor included in the PWM amplifier. In FIG. 5, similar elements to those in FIG. 4 are identified by the same reference numerals as those used in FIG. 4. A diode $D_1$ is provided for half-wave rectifying the push-pull output. An anode of the diode $D_1$ is connected to an output of the push-pull circuit so as to rectify only a high level ($+V_{cc}$) in the on state of the P channel-transistor $Q_1$ to thereby detect an excess current therein. The rectified output is applied through a resistor $R_2$ to an integrator. The integrator is composed of a series-coupled capacitor $C_1$ and a resistor $R_3$ connected between the power source $+V_{cc}$ and ground. The voltage at the junction between the capacitor $C_1$ and resistor $R_3$, which forms the integration output, is applied to the base of a PNP transistor $Q_4$.

The emitter of the transistor $Q_4$ is connected to a reference voltage source having an output voltage E. Therefore, the emitter reference voltage is $+V_{cc}$ level shifted by E, i.e., $+V_{cc}-E$. The collector output of this transistor is used as the detection output of the excess current detection circuit.

Figure 6:
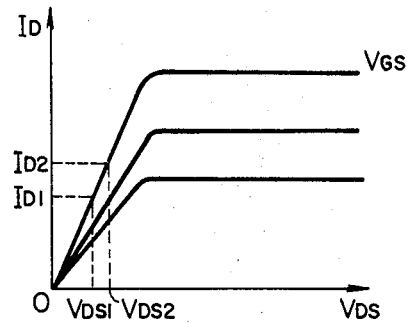
FIG. 6 is an output characteristic curve of a switching element.
Figure 7:
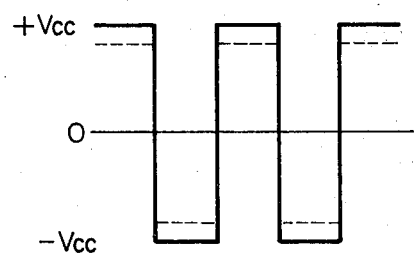
FIG. 7 is a push-pull output waveform of the PWM amplifier.

FIGS. 6 and 7 are explanatory graphs relating to the operation of the circuit in FIG. 5, in which FIG. 6 shows output characteristics of the output transistors $Q_1$ and $Q_2$ and FIG. 7 shows a push-pull output waveform. As is clear from FIG. 6, the voltage $V_{DS}$ across the conductive channel in the on state of the switching operation varies largely with respect to the on state current $I_D$ if the gate voltage $V_{GS}$ is constant. For example, when the channel $I_{DI}$ flows under a certain load condition, the voltage across the channel in $V_{DS1}$ increases up to $V_{DS2}$ when the channel current increases to $I_{D2}$ with an increased load for the same gate voltage.

Accordingly, the push-pull output waveform under no load conditions is a PWM signal having $+V_{cc}$ and $-V_{cc}$ levels as shown by a solid line in FIG. 7. However, under a load, the levels of the PWM signal are lowered by the interchannel voltage $V_{DS}$ corresponding to the load, respectively, i.e., $(+V_{cc}-V_{DS})$ and $(-V_{cc}+V_{DS})$.

In view of this fact, since in the circuit in FIG. 5, the push-pull output voltage under no load is substantially the same as the power source voltage, the rectified output has levels of zero and $+V_{cc}$. Therefore, the amount of charge stored in capacitor $C_1$ is small and the voltage across the capacitor is correspondingly small resulting in a relatively high integration voltage. Thus, it is possible to hold the transistor $Q_4$ in the off state.

With an increase of the load 11, the push-pull output level is lowered and the amount of charge on the capacitor $C_1$ increases correspondingly resulting in a decrease of the integration voltage. As the channel current increases with a further increase of the load, the integration voltage decreases below the reference voltage $(+V_{cc}-E)$, the transistor $Q_4$ turns on producing the detection output by which the protective circuit (not shown) is activated.

Since a PWM signal is always present even if there is no input audio signal so that the output transistors are always switched between on and off states repeatedly, it is possible to perform normal detection operations without an input audio signal.

In this embodiment, since the excess current is detected without the provision of a resistor in the current line, there is no power loss. Furthermore, since one end of the capacitor forming the integrator circuit is connected to $+V_{cc}$ to set the reference voltage for integration to $+V_{cc}$ and the emitter reference voltage of the transistor $Q_4$ is derived from the same source $+V_{cc}$, it is possible to precisely detect excess current even if the power source voltage varies.

It is believed clear that excess current detection for the N channel transistor $Q_2$ can be performed in the same way as described for the P channel transistor.

Switching elements other than MOS transistors can be used with the invention so long as the voltage across the conductive channel varies in response to the current in the on state in the switching operation thereof.

What is claimed is:

1. A pulse width modulation amplifier comprising: a comparator, an inverting input terminal of said comparator being coupled to an input signal source through a first resistor; a ramp wave oscillator having an output coupled to a non-inverting input of said comparator; a switching amplifier having an input coupled to an output of said comparator; a low-pass filter having an input coupled to an output of said switching amplifier; a second resistor coupled between said output of said switching amplifier and said inverting input terminal of said comparator; and a capacitor coupled between said inverting input terminal of said comparator and ground.

2. A pulse width modulation amplifier of claim 1 wherein said switching amplifier comprises an output circuit including an active element coupled to an output of said comparator wherein a voltage applied across said active element is switched between on and off states and means operating in response to said voltage across said active element for producing a detection signal for indicating when an excess current flows through said active element.

3. The pulse width modulation amplifier of claim 2 wherein said means for producing said detection signal comprises voltage generator means coupled to said active element for producing a voltage corresponding to an output level of said active element in the on state and detection signal generator means operating in response to said voltage generator means for producing said detection signal.

4. The pulse width modulation amplifier of claim 3 wherein said voltage generator means comprises a diode for rectifying an output of said active element and an integrator circuit for integrating the rectified output.

5. The pulse width modulation amplifier of claim 4 wherein detection signal generator means comprises means for comparing a reference voltage with an output of said integrator.

6. The pulse width modulation amplifier of claim 5 wherein:
said active element comprises first and second push-pull connected output switching transistors;
said amplifier further comprises a load having one input terminal coupled to a junction between said first and second transistors;
said diode having one terminal coupled to said junction between said first and second transistors; and
said voltage generator means comprises a first resistor having a first terminal coupled to a second terminal of said diode; a second resistor having a first terminal coupled to a second terminal of said first resistor and a second terminal coupled to ground; a capacitor having a first terminal coupled to said second terminal of said first resistor and said first terminal of said second resistor and a second terminal coupled to a supply voltage; a third transistor having a base coupled to said first terminal of said capacitor and an emitter coupled through a reference voltage source to said supply voltage, said detection signal being produced on a collector of said third transistor.

7. In a pulse width modulation amplifier having an output circuit including an active element wherein a voltage applied across said active element is switched between on and off states, a voltage generator means coupled to said active element for producing a voltage corresponding to an output level of said active element in the on state, and a detection signal generator means for producing a detection signal for indicating when an excess current flows through said active element, said detection signal generator means operating in response to said voltage generator means, wherein said voltage generator means comprises: a diode for rectifying an output of said active element; and an integrator circuit for integrating the rectified output.

* * * * *